US009165966B2

(12) United States Patent
Shin et al.

(10) Patent No.: US 9,165,966 B2
(45) Date of Patent: Oct. 20, 2015

(54) CMOS IMAGE SENSORS INCLUDING AN ISOLATION REGION ADJACENT A LIGHT-RECEIVING REGION

(71) Applicant: Samsung Electronics Co., Ltd., Suwon-si (KR)

(72) Inventors: Jae Sung Shin, Hwaseong-si (KR); Minseok Oh, Osan-si (KR); Sungsoo Choi, Seongnam-si (KR); Hyoungsoo Ko, Hwaseong-si (KR); Taechan Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/268,230

(22) Filed: May 2, 2014

(65) Prior Publication Data
US 2014/0361355 A1 Dec. 11, 2014

(30) Foreign Application Priority Data

Jun. 7, 2013 (KR) ........................ 10-2013-0065351

(51) Int. Cl.
*H01L 27/146* (2006.01)
*H01L 27/105* (2006.01)
*H01L 31/0232* (2014.01)

(52) U.S. Cl.
CPC ........ *H01L 27/1463* (2013.01); *H01L 27/1464* (2013.01); *H01L 27/14627* (2013.01); *H01L 27/14643* (2013.01)

(58) Field of Classification Search
None
See application file for complete search history.

(56) References Cited

U.S. PATENT DOCUMENTS

| 6,563,187 | B1 * | 5/2003 | Park ............................. 257/446 |
| 7,728,269 | B2 | 6/2010 | Lichtsteiner et al. |
| 2003/0127667 | A1 | 7/2003 | Inoue et al. |
| 2005/0184291 | A1 * | 8/2005 | Cole et al. ........................ 257/59 |
| 2008/0157140 | A1 | 7/2008 | Cho |
| 2008/0251821 | A1 * | 10/2008 | Ko et al. ........................ 257/292 |
| 2009/0309144 | A1 * | 12/2009 | Park et al. ..................... 257/292 |
| 2010/0252870 | A1 * | 10/2010 | Lin et al. ....................... 257/291 |

(Continued)

FOREIGN PATENT DOCUMENTS

| JP | 2003-142674 | 5/2003 |
| JP | 2005-340498 | 12/2005 |
| KR | 100730469 B1 | 6/2007 |

(Continued)

OTHER PUBLICATIONS

Definition of adjacent downloaded from URL < http://www.merriam-webster.com/dictionary/adjacent > on Dec. 17, 2014.*

(Continued)

*Primary Examiner* — Joseph Schoenholtz
(74) *Attorney, Agent, or Firm* — Myers Bigel Sibley & Sajovec, PA

(57) ABSTRACT

CMOS image sensors are provided. A CMOS image sensor may include a semiconductor substrate including a light-receiving region and a logic region adjacent the light-receiving region. The CMOS image sensor may include a photoelectric conversion region in the light-receiving region. Moreover, the CMOS image sensor may include an isolation region including an interface with a sidewall of the photoelectric conversion region. The isolation region may include a first refractive index that is smaller than a second refractive index of the semiconductor substrate, and the isolation region may be between the logic region and the sidewall of the photoelectric conversion region.

11 Claims, 17 Drawing Sheets

(56) References Cited

U.S. PATENT DOCUMENTS

2011/0187912 A1     8/2011     Arayashiki et al.
2011/0226936 A1*     9/2011     Pain et al. .................. 250/214.1

FOREIGN PATENT DOCUMENTS

| KR | 1020070070427 A | 7/2007 |
| KR | 1020080061029 A | 7/2008 |
| KR | 1020090129092 A | 12/2009 |

OTHER PUBLICATIONS

Definition of interface downloaded from URL < http://www.merriam-webster.com/dictionary/interface > on Dec. 18, 2014.*

P. Lichtsteiner et al., "A 128 X 128 120 dB 15 _s Latency Asynchronous Temporal Contrast Vision Sensor", IEEE Journal of Solid-State Circuits, vol. 43, No. 2, Feb. 2008, pp. 566-576.

* cited by examiner

US 9,165,966 B2

CMOS IMAGE SENSORS INCLUDING AN ISOLATION REGION ADJACENT A LIGHT-RECEIVING REGION

CROSS-REFERENCE TO RELATED APPLICATION

This U.S. non-provisional patent application claims priority under 35 U.S.C. §119 to Korean Patent Application No. 10-2013-0065351, filed on Jun. 7, 2013, the disclosure of which is hereby incorporated herein in its entirety by reference.

BACKGROUND

The present disclosure herein relates to Complementary Metal-Oxide-Semiconductor (CMOS) image sensors. An image sensor is a device that converts optical images into electrical signals. With increased development of the computer and communications industries, there is an increased demand for high performance image sensors in a variety of applications such as digital cameras, camcorders, personal communication systems, gaming machines, security cameras, micro-cameras for medical applications, and/or robots.

CMOS image sensors may be operated using a relatively simple operation method and may be configured to have signal processing circuits integrated on a single chip, thus enabling products that include the CMOS image sensors to be scaled down. In addition, CMOS image sensors may operate with relatively low power consumption. Thus, CMOS image sensors may be applicable to portable electronic devices. Furthermore, CMOS image sensors may be fabricated using CMOS fabrication techniques, which may reduce manufacturing costs. Moreover, CMOS image sensors may provide high resolution images. Accordingly, the use of CMOS image sensors has increased.

SUMMARY

Example embodiments of the inventive concepts may provide a CMOS image sensor with improved electric characteristics. Various embodiments of the present inventive concepts provide a CMOS image sensor including a semiconductor substrate of a first conductivity type including a plurality of pixel regions, each of the plurality of pixel regions including a light-receiving region and a logic region adjacent the light-receiving region. The CMOS image sensor may include a photoelectric conversion layer of a second conductivity type in the light-receiving region of the semiconductor substrate. The CMOS image sensor may include a first device isolation layer in the semiconductor substrate to define the light-receiving region of each of the pixel regions. The first device isolation layer may be adjacent a sidewall of the photoelectric conversion layer. Moreover, the CMOS image sensor may include a second device isolation layer in the semiconductor substrate to define the logic region. The second device isolation layer may include a first depth in the semiconductor substrate that is shallower than a second depth of the first device isolation layer in the semiconductor substrate, and the photoelectric conversion layer may extend to a third depth that is deeper than the first depth of the second device isolation layer and shallower than the second depth of the first device isolation layer.

In various embodiments, the CMOS image sensor may include a doped well impurity layer of the second conductivity type in a portion of the logic region of the semiconductor substrate. Moreover, the CMOS image sensor may include NMOS transistors on the logic region of the semiconductor substrate, and PMOS transistors on the doped well impurity layer. In some embodiments, the doped well impurity layer may be between the first and second device isolation layers.

According to various embodiments, the first device isolation layer may include an insulating layer including a first refractive index that is smaller than a second refractive index of the semiconductor substrate. Moreover, the first device isolation layer may include at least two insulating layers including different respective refractive indices, and one of the at least two insulating layers may contact the semiconductor substrate and may have a first refractive index that is different from a second refractive index of the semiconductor substrate.

In various embodiments, the CMOS image sensor may include a doped impurity layer of the first conductivity type that is in the semiconductor substrate and that is spaced apart from a surface of the semiconductor substrate. A surface of the first device isolation layer may contact the doped impurity layer of the first conductivity type. In some embodiments, the first device isolation layer may extend into the doped impurity layer of the first conductivity type.

According to various embodiments, the CMOS image sensor may include a wiring layer on a surface of the semiconductor substrate. The wiring layer may include a plurality of overlapping/stacked interconnection lines on the logic region. The CMOS image sensor may include a light transmission layer on the wiring layer. The light transmission layer may include micro-lenses overlapping respective ones of the pixel regions.

In various embodiments, the CMOS image sensor may include a wiring layer on a surface of the semiconductor substrate. The wiring layer may include a plurality of overlapping/stacked interconnection lines. The CMOS image sensor may include a light transmission layer on a surface of the semiconductor substrate. The light transmission layer may include micro-lenses overlapping respective ones of the pixel regions. Moreover, the first device isolation layer may have a tapered width in the semiconductor substrate.

A CMOS image sensor, according to various embodiments, may include a semiconductor substrate of a first conductivity type. The semiconductor substrate may include a light-receiving region and a logic region defining a perimeter around the light-receiving region. The CMOS image sensor may include a photoelectric conversion layer of a second conductivity type in the light-receiving region of the semiconductor substrate. The CMOS image sensor may include a first device isolation layer in the semiconductor substrate adjacent a sidewall of the photoelectric conversion layer, and a second device isolation layer in the semiconductor substrate to define the logic region. The second device isolation layer may include a first depth in the semiconductor substrate that is shallower than a second depth of the first device isolation layer in the semiconductor substrate.

In various embodiments, the CMOS image sensor may include a doped well impurity layer of the second conductivity type in a portion of the logic region of the semiconductor substrate. The CMOS image sensor may include NMOS transistors on the logic region of the semiconductor substrate. Moreover, the CMOS image sensor may include PMOS transistors on the doped well impurity layer.

According to various embodiments, an entire length of the sidewall of the photoelectric conversion layer may contact a sidewall of the first device isolation layer. Moreover, the first device isolation layer may include an insulating material including a first refractive index that is smaller than a second refractive index of the semiconductor substrate. In some embodiments, the CMOS image sensor may include a doped impurity layer that is of the first conductivity type in the semiconductor substrate and that is spaced apart from a surface of the semiconductor substrate. The first device isolation layer may contact the doped impurity layer of the first conductivity type.

A CMOS image sensor, according to various embodiments, may include a semiconductor substrate including a light-receiving region and a logic region adjacent the light-receiving region. The CMOS image sensor may include a photoelectric conversion region in the light-receiving region. Moreover, the CMOS image sensor may include an isolation region defining a perimeter around the photoelectric conversion region in the semiconductor substrate and including an interface with a sidewall of the photoelectric conversion region. The isolation region may include a first refractive index smaller than a second refractive index of the semiconductor substrate, and the isolation region may be between the logic region and the sidewall of the photoelectric conversion region.

In various embodiments, the semiconductor substrate may include a first conductivity type, and the photoelectric conversion region may include a second conductivity type different from the first conductivity type. Moreover, the light-receiving region may be configured to convert an optical signal into an electrical signal, and the logic region may include circuitry configured to process the electrical signal. In some embodiments, the isolation region may include a first depth in the semiconductor substrate that is deeper than a second depth of the photoelectric conversion region in the semiconductor substrate.

According to various embodiments, the semiconductor substrate may include an epitaxial layer of the first conductivity type in the logic region, and the isolation region may be between the epitaxial layer of the first conductivity type in the logic region and the sidewall of the photoelectric conversion region. Moreover, the CMOS image sensor may include a micro-lens that overlaps the photoelectric conversion region, the isolation region may include a first isolation region including a tapered width in the semiconductor substrate, and the CMOS image sensor may include a second isolation region that is adjacent the logic region and that includes a third depth that is shallower in the semiconductor substrate than the second depth of the photoelectric conversion region and is shallower in the semiconductor substrate than the first depth of the first isolation region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
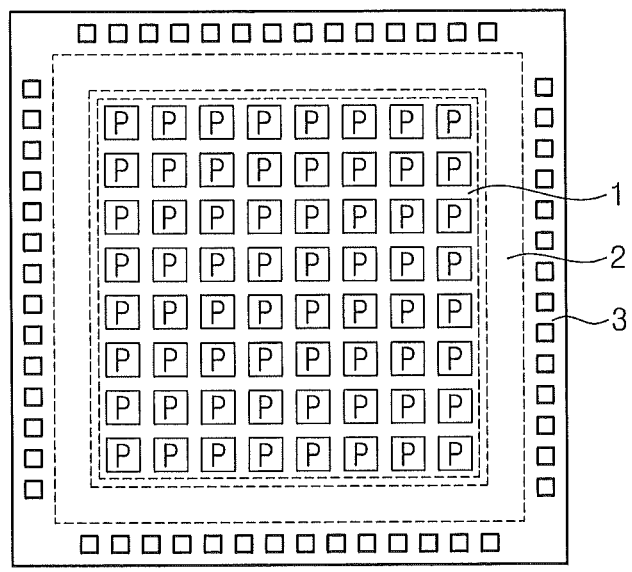
FIG. 1 is a plan view illustrating an image sensor according to example embodiments of the inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a plan view illustrating an image sensor according to example embodiments of the inventive concept. Referring to FIG. 1, a CMOS image sensor may include a sensor array region 1, a control circuit region 2, and a pad region 3.

The sensor array region 1 may include a plurality of unit pixels P arranged in the form of matrix. In the sensor array region 1, electrical signals may be produced by incident light. The control circuit region 2 may include control circuits controlling the unit pixels P of the sensor array region 1. For example, control circuits, such as row decoders, row drivers, column decoders, timing generators, and I/O buffers may be disposed in the control circuit region.

The pad region 3 may include a plurality of conductive pads for transmitting control signals and photoelectric signals. The pad region 3 may be disposed at an edge portion of the image sensor to facilitate electrical connections between the image sensor and external devices.

Figure 2:
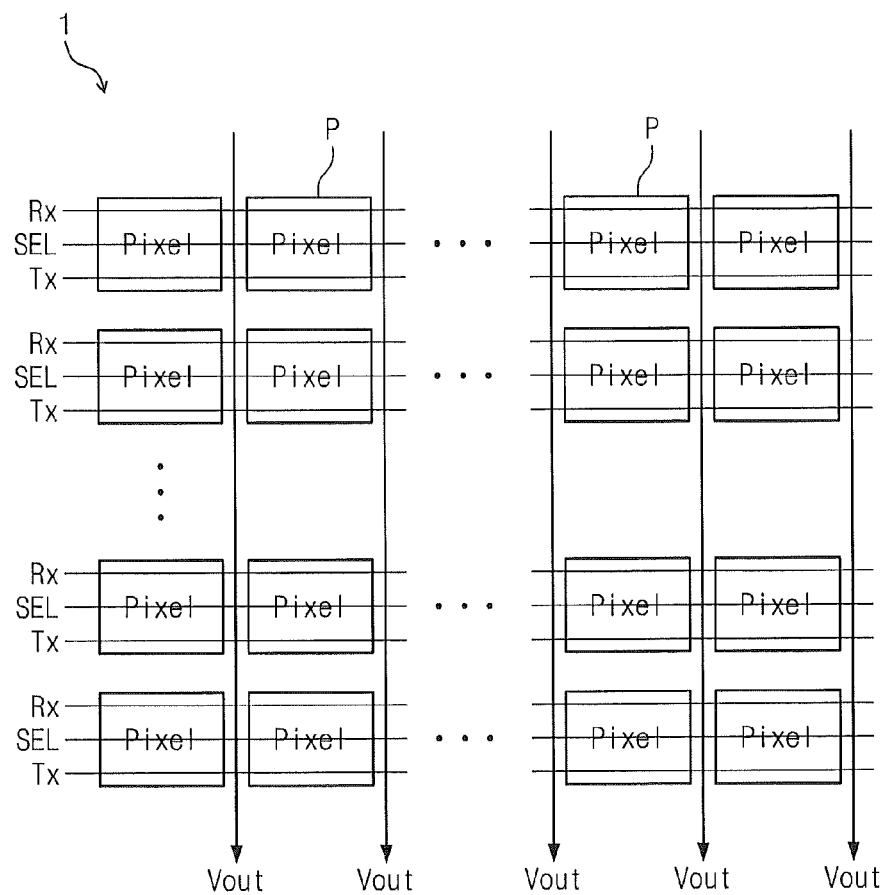
FIG. 2 is a schematic circuit diagram illustrating a sensor array of an image sensor according to example embodiments of the inventive concepts.

FIG. 2 is a schematic circuit diagram illustrating a sensor array of an image sensor according to example embodiments of the inventive concepts. Referring to FIG. 2, the sensor array may include a plurality of unit pixels P that are two-dimensionally arranged. In each of the unit pixels P, an electrical signal may be produced by incident light. The unit pixels P may be operated by operation signals that are transmitted through pixel selection lines SEL, charge transmission lines Tx, and reset lines Rx that are coupled to the unit pixels P. Further, the electrical signals converted in the unit pixels P may be transmitted to the control circuit through output lines Vout.

Figure 3:
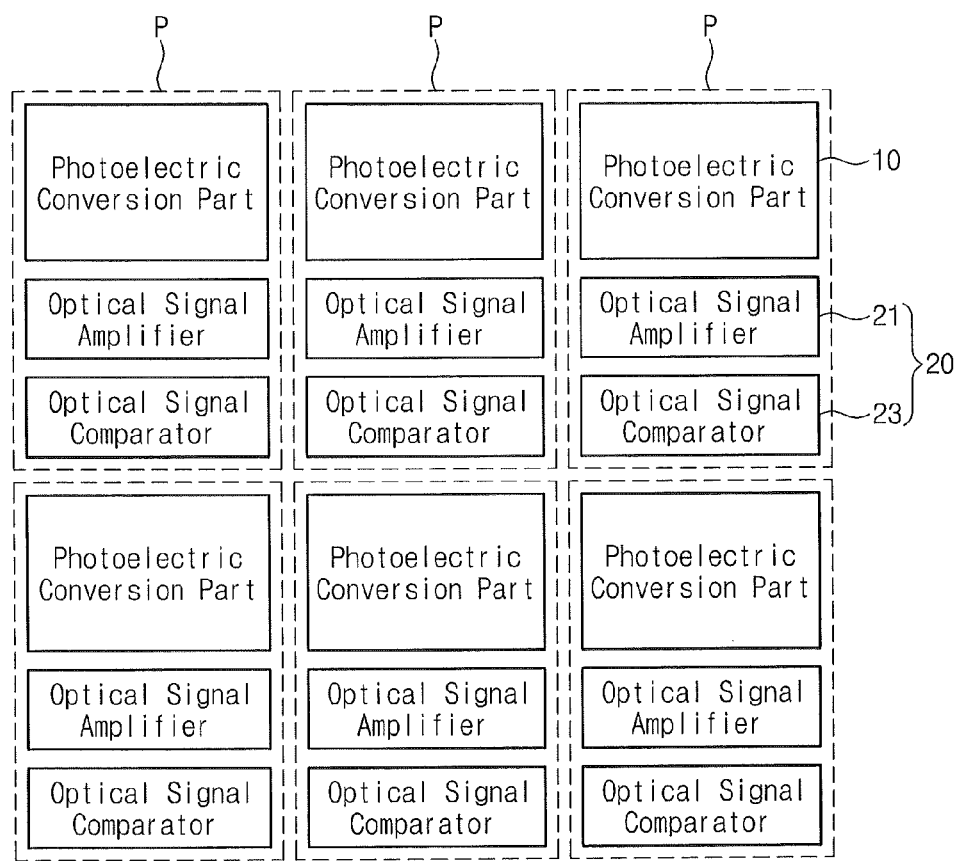
FIG. 3 is a block diagram illustrating a sensor array of an image sensor according to example embodiments of the inventive concepts.
Figure 4:
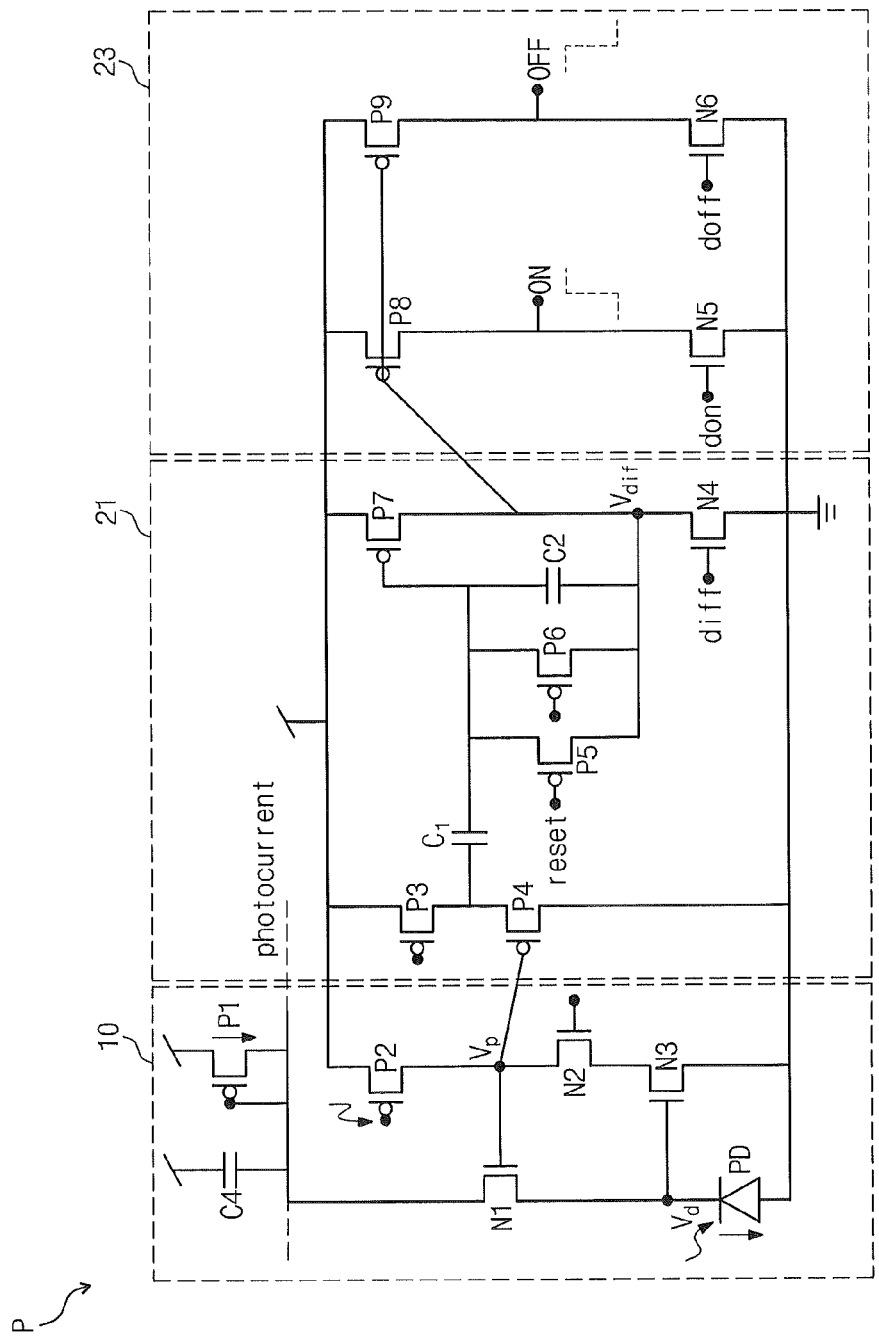
FIG. 4 is a schematic circuit diagram illustrating a unit pixel of an image sensor according to example embodiments of the inventive concepts.

FIG. 3 is a block diagram illustrating a sensor array of an image sensor according to example embodiments of the inventive concepts. FIG. 4 is a schematic circuit diagram illustrating a unit pixel of an image sensor according to example embodiments of the inventive concepts.

According to example embodiments of the inventive concepts, the CMOS image sensor may be configured to measure a real-time variation in contrast of an object and thereby detect a motion of the object. Each of the unit pixels P of the CMOS image sensor may include a photoelectric conversion part 10 converting optical signal into electrical signal and a logic circuit 20 processing the electrical signal produced in the photoelectric conversion part 10.

Referring to FIGS. 3 and 4, each of the unit pixels P may include the photoelectric conversion part 10, an optical signal amplifier 21, and an optical signal comparator 23. The photoelectric conversion part 10 may be configured to produce electric charges from the incident light, convert the produced electric charges into an analog voltage, and transmit the converted analog voltage to the logic circuit 20.

As shown in FIG. 4, the photoelectric conversion part 10 may include a photodiode PD, an NMOS transistor N1, and an inverting amplifier N2, N3, and P2. Here, the photodiode PD may produce a photocurrent having an amount that is proportional to an intensity of the incident light. In some embodiments, the unit pixel P may include at least one of a photo transistor, a photo gate, a pinned photo diode (PPD), and any combination thereof, instead of the photodiode PD. The inverting amplifier N2, N3, and P2 may be configured to output an analog voltage VP that is proportional to a logarithm of the photocurrent from the photodiode PD. For example, the analog voltage VP outputting from the photoelectric conversion part 10 may vary depending on the intensity of the incident light.

The logic circuit 20 may be configured to convert the analog signal output from the photoelectric conversion part 10 into a digital signal. For example, the logic circuit 20 may include an optical signal amplifier 21 and an optical signal comparator 23. The optical signal amplifier 21 may be configured to amplify the electrical signal produced in the photoelectric conversion part 10 and transmit the amplified signal to the optical signal comparator 23. In example embodiments, the optical signal amplifier 21 may be provided in the form of differencing circuit. The optical signal comparator 23 may be configured to compare the analog voltage output from the optical signal amplifier 21 with a reference voltage and thereby output a digital signal corresponding to the comparison result. The optical signal amplifier 21 and the optical signal comparator 23 may include NMOS transistors N4, N5, and N6, PMOS transistors P3, P4, P5, P6, P7, P8, and P9, and capacitors C1 and C2, as shown in FIG. 4.

Figure 5:
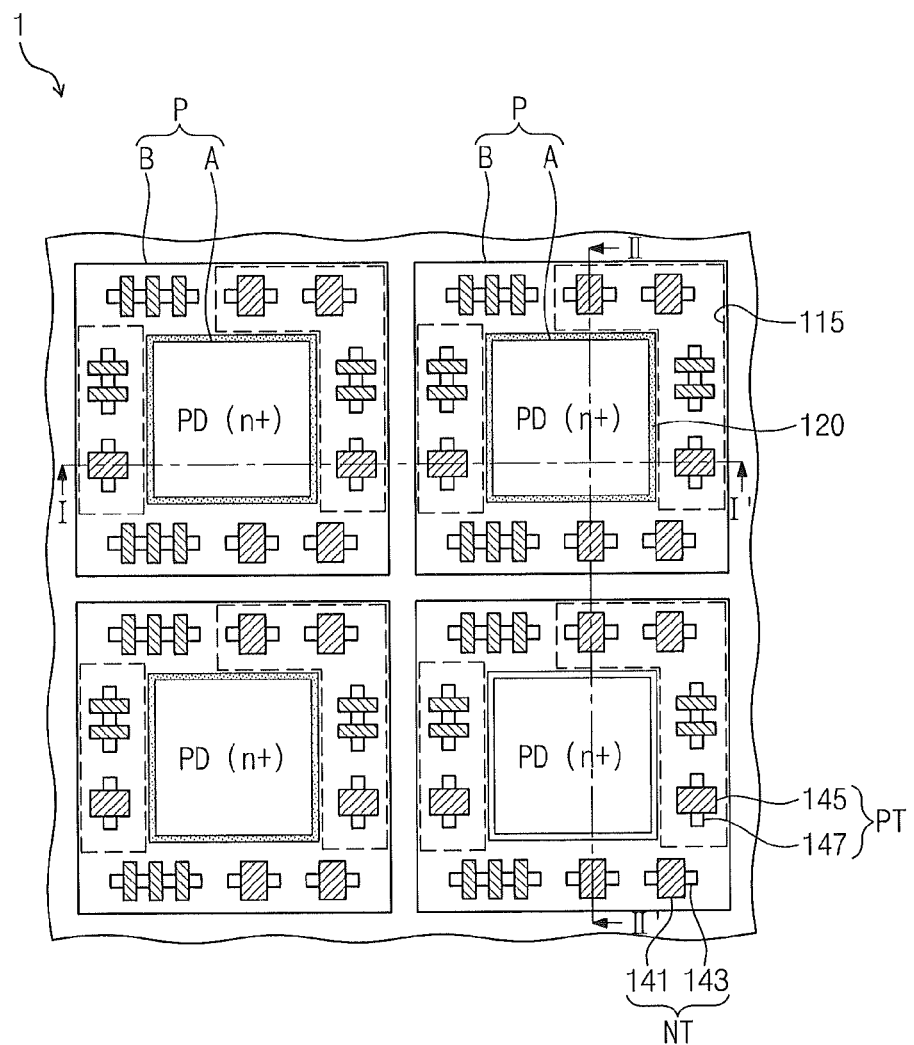
FIG. 5 is a plan view illustrating a unit pixel of an image sensor according to example embodiments of the inventive concepts.
Figure 6:
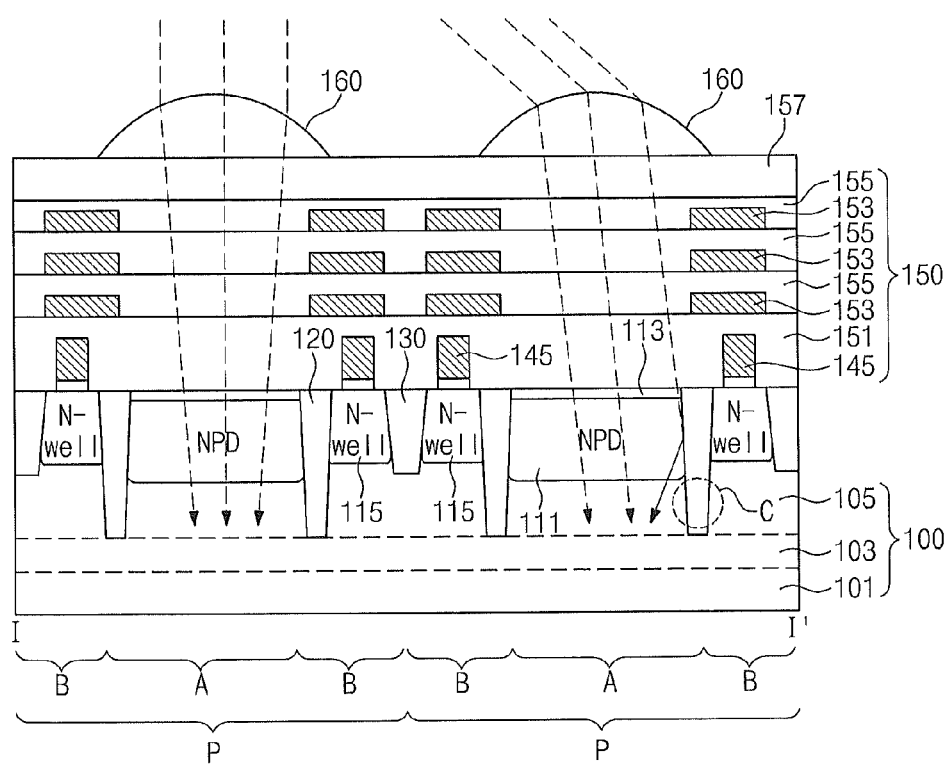
FIG. 6 is a sectional view taken along line I-I' of FIG. 5, to illustrate the unit pixel of the image sensor according to example embodiments of the inventive concepts.
Figure 7:
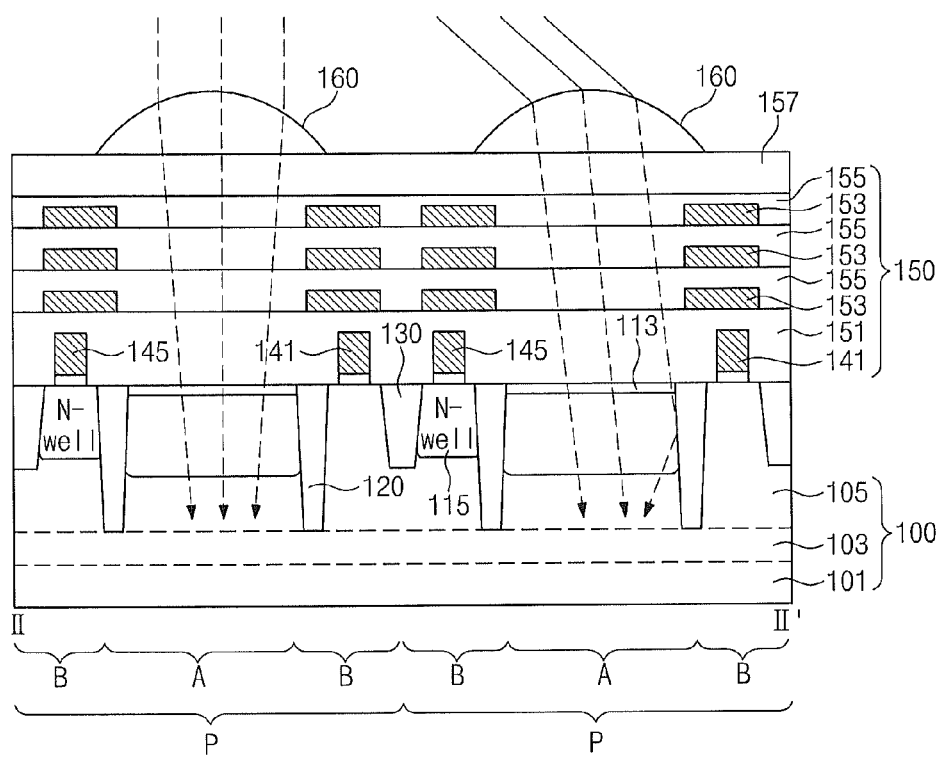
FIG. 7 is a sectional view taken along line II-II' of FIG. 5, to illustrate the unit pixel of the image sensor according to example embodiments of the inventive concepts.
Figure 8:
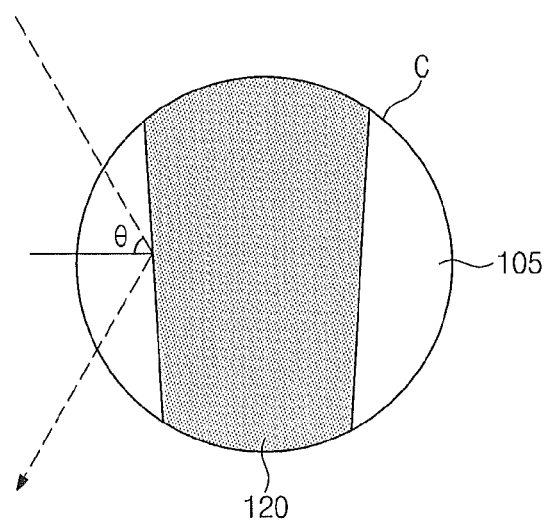
FIGS. 8 and 9 are enlarged views illustrating a portion C of FIG. 6.
Figure 9:
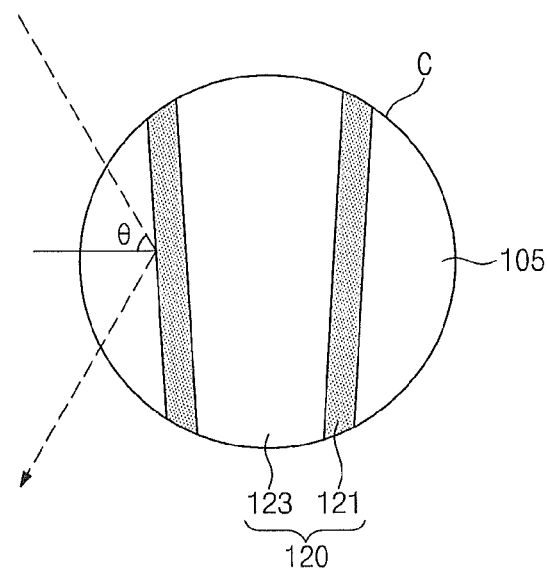

FIG. 5 is a plan view illustrating a unit pixel of an image sensor according to example embodiments of the inventive concepts. FIG. 6 is a sectional view taken along line I-I' of FIG. 5, to illustrate the unit pixel of the image sensor according to example embodiments of the inventive concepts. FIG. 7 is a sectional view taken along line II-II' of FIG. 5, to illustrate the unit pixel of the image sensor according to example embodiments of the inventive concepts. FIGS. 8 and 9 are enlarged views illustrating a portion C of FIG. 6.

Referring to FIGS. 5 through 7, a semiconductor substrate 100 may include a plurality of pixel regions P (e.g., unit pixel regions P) that are two-dimensionally arranged. Each of the pixel regions P may include a light-receiving region A and a logic region B around the light-receiving region A. In example embodiments, the light-receiving region A may be defined by a first device isolation layer 120, and the pixel region P may be defined by a second device isolation layer 130. The logic region B may be positioned between the first device isolation layer 120 and the second device isolation layer 130.

In example embodiments, the semiconductor substrate 100 may include a p-type bulk substrate 101 and a p-type epitaxial layer 105 formed on the p-type bulk substrate 101. A p-type deep well 103 (for example, having high impurity concentration) may be provided in the p-type epitaxial layer 105. The p-type deep well 103 may be spaced apart from a surface of the p-type epitaxial layer 105 to be adjacent to the bulk substrate 101. For example, the p-type deep well 103 may be interposed between the p-type epitaxial layer 105 and the bulk substrate 101. The p-type deep well 103 may have an impurity concentration that is higher than those of the p-type bulk substrate 101 and the p-type epitaxial layer 105. The p-type deep well 103 may serve as a potential barrier preventing/impeding electric charges produced in the bulk substrate 101 from being diffused into the photodiode. For the semiconductor substrate 100 having the p-type bulk substrate 101, the p-type deep well 103, and the p-type epitaxial layer 105, a surface of the p-type epitaxial layer 105 may be referred to as a front surface of the semiconductor substrate 100, and a surface of the p-type bulk substrate 101 may be referred to as a back surface of the semiconductor substrate 100.

Example embodiments of the inventive concepts may not be limited to the afore-described embodiment, in which the semiconductor substrate 100 is configured to include the p-type epitaxial layer 105 grown from the p-type bulk substrate 101. For example, the p-type bulk substrate 101 may be replaced with an n-type bulk substrate. Further, the semiconductor substrate 100 may be configured to include a p-type well formed in the bulk substrate, instead of the p-type epitaxial layer 105. The semiconductor substrate 100 may be a silicon-on-insulator (SOI) wafer including a semiconductor layer provided on an insulating layer. In other words, a structure of the semiconductor substrate 100 may be variously modified.

In example embodiments, an n-type impurity region 111 may be formed in the p-type epitaxial layer 105 of the light-receiving region A. The photodiode may be formed by a junction of the p-type epitaxial layer 105 and the n-type impurity region 111. If light is incident into the n-type impurity region 111 of the photodiode, electric charges may be produced and accumulated. Furthermore, the photo diode may further include a p-type impurity region 113 shallowly formed near a surface of the n-type impurity region 111. The p-type impurity region 113 may make it possible to reduce a dark current, which may result from silicon surface defects and consequent electron-hole pairs.

In plan view, the n-type impurity region 111 of the photodiode may be shaped like a rectangle and be enclosed by the first device isolation layer 120. For example, the first device isolation layer 120 may be formed to surround a sidewall of the n-type impurity region 111. In other words, the whole sidewall of the n-type impurity region 111 may be in direct contact with a sidewall of the first device isolation layer 120. The first device isolation layer 120 may be formed to be deeper than a depth of the n-type impurity region 111. For example, a bottom surface of the first device isolation layer 120 may be positioned below a bottom surface of the n-type impurity region 111. Further, according to the present embodiment, the bottom surface of the first device isolation layer 120 may be in direct contact with the p-type deep well 103.

The first device isolation layer 120 may be formed of an insulating material, whose refractive index is lower than that of the semiconductor substrate 100 (e.g., of silicon). For example, the first device isolation layer 120 may be formed of at least one of a silicon oxide layer, a silicon nitride layer, air, or any combination thereof. The first device isolation layer 120 may be formed by patterning a front surface of the semiconductor substrate 100 to form a trench and then, filling the trench with an insulating material. The first device isolation layer 120 may reflect or refract an incident light that is incident to the light-receiving region at an angle. Accordingly, it may be possible to prevent/impede the incident light from being incident into the logic region, and thus, it may be possible to prevent/impede electric charges from being unintentionally produced in the logic region of the semiconductor substrate. Further, the first device isolation layer 120 may prevent/impede electric charges, which may be produced in the p-type epitaxial layer 105 of the light-receiving region A, from being flowed into the logic region B adjacent to the light-receiving region A through a random drift process.

As shown in FIG. 8, the first device isolation layer 120 may be formed of an insulating material having a refractive index lower than that of the semiconductor substrate 100. Here, the first device isolation layer 120 may be configured to realize the total reflection of the incident light at an interface between the first device isolation layer 120 and the semiconductor substrate 100. For example, the semiconductor substrate 100 and the first device isolation layer 120 may be configured to satisfy the condition of $(n1 \sin\theta)/n2 > 1$, where $n1$ and $n2$ are refractive indices of the semiconductor substrate 100 and the first device isolation layer 120, respectively. Accordingly, even if the light is incident at an angle to the micro-lenses 160, the light can be reflected from the interface between the p-type epitaxial layer 105 and the first device isolation layer 120 and be propagated toward the p-type epitaxial layer 105.

In some embodiments, as shown in FIG. 9, the first device isolation layer 120 may include at least two insulating layers, whose refractive indices are different from each other. For example, the first device isolation layer 120 may include a first insulating layer 121, which is in contact with the p-type epitaxial layer 105 and has a refractive index smaller than the semiconductor substrate 100, and a second insulating layer 123 having a refractive index different from that of the first insulating layer 121. If the light is incident at an angle to the light-receiving region A, the incident light may be reflected at an interface between the p-type epitaxial layer 105 and the first insulating layer 121 or between the first and second insulating layers 121 and 123.

Referring again to FIGS. 5 through 7, the second device isolation layer 130 may be provided between the pixel regions P and be formed to be shallower than the first device isolation layer 120. In other words, a vertical depth of the second device isolation layer 130 may be smaller than that of the first device isolation layer 120. For example, the second device isolation layer 130 may have a bottom surface that is higher than that of the first device isolation layer 120. Further, the bottom surface of the second device isolation layer 130 may be located at a level that is substantially equal to or higher than that of the n-type impurity region 111.

In example embodiments, the NMOS and PMOS transistors NT and PT may be provided on the logic region B of the semiconductor substrate 100. For example, an n-type doped well region 115 may be formed in the p-type epitaxial layer 105 of the logic region B. Alternatively, the n-type doped well region 115 and an p-type well may be formed in the bulk substrate 101 of the logic region B.

NMOS gate electrodes 141 may be provided on the p-type epitaxial layer 105 of the logic region B, and n-type source/drain impurity regions 143 may be provided in the p-type epitaxial layer 105 at both sides of the NMOS gate electrode 141. PMOS gate electrodes 145 may be provided on the n-type doped well region 115 of the logic region B, and p-type source/drain impurity regions 147 may be provided in the n-type doped well region 115 at both sides of the PMOS gate electrodes 145. The p-type epitaxial layer 105 of the logic region B may serve as a channel region of the NMOS transistors NT, and the n-type doped well region 115 of the logic region B may serve as a channel region of the PMOS transistors PT. In example embodiments, the n-type doped well region 115 in the p-type epitaxial layer 105 may be provided between the first device isolation layer 120 and the second device isolation layer 130. For example, the first device isolation layer 120 may be provided between the n-type doped well region 115 and the n-type impurity region 111, and the second device isolation layer 130 may be provided between adjacent pixel regions P and adjacent n-type doped well regions 115.

In example embodiments, a light transmission layer including a wiring layer 150 and micro-lenses 160 may be provided on the semiconductor substrate 100 provided with the n-type impurity regions 111 and the n-type doped well regions 115. The wiring layer 150 may include NMOS and PMOS transistors NT and PT and capacitors, which are provided on the logic region B, and a lower interlayer insulating layer 151 covering them. The wiring layer 150 may include a plurality of upper interlayer insulating layers 155 vertically stacked one on the other and a plurality of metal interconnection lines 153 vertically stacked one on the other (for example, between the interlayer insulating layers 155). The metal interconnection lines 153 may be connected to logic devices, such as the NMOS and PMOS transistors NT and PT, or other interconnection lines through contact plugs. In some embodiments, the metal interconnection lines 153 may be vertically stacked on the logic region B, and the interlayer insulating layers 155 may be stacked on the logic region B and the light-receiving region A. Further, a planarization layer 157 may be provided as the uppermost layer of the wiring layer 150.

The micro-lenses 160 may be provided on the wiring layer 150 to guide the incident light toward the light-receiving region A. Each of the micro-lenses 160 may be located on a corresponding one of the light-receiving regions A. The micro-lens 160 may have an upward convex profile, and thus, portions of the incident light that do not travel toward the light-receiving region A can have a changed path traveling toward the photodiode. The micro-lens 160 may be formed of an optically-transparent resin. The light transmission layer (which includes the wiring layer 150 and the micro-lenses 160) may include a color filter layer that is provided below the micro-lens 160 to realize color images.

In the CMOS image sensor of FIGS. 5 through 7, if the light is incident into some of the pixel regions P, which may be positioned at a central portion of the CMOS image sensor, the incident light may be focused onto the light-receiving region A by the micro-lens 160. By contrast, if the light is incident into others of the pixel regions P, which may be positioned at an edge portion of the CMOS image sensor, the light may be incident at an angle to the p-type epitaxial layer 105 of the logic region B. However, the slantingly-incident light may be reflected at an interface between the first device isolation layer 120 and the semiconductor substrate 100. Accordingly, it may be possible to prevent/impede the light from being incident into the p-type epitaxial layer 105 of the logic region B and thereby prevent/protect logic devices of the logic region B from being deteriorated by unintended electric charges.

FIGS. 10 through 16 are sectional views illustrating image sensors according to example embodiments of the inventive concepts. For concise description, a previously described element may be identified by a similar or identical reference number without repeating an overlapping description thereof.

Figure 10:
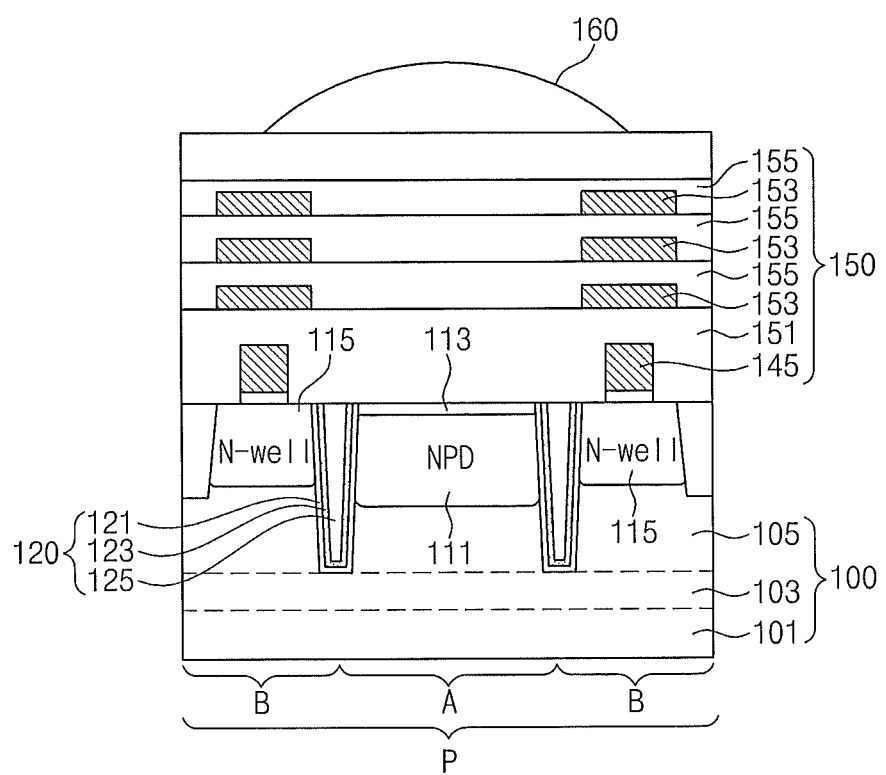
FIGS. 10 through 16 are sectional views illustrating image sensors according to example embodiments of the inventive concepts.

As shown in FIG. 10, each pixel region P may include the light-receiving region A and the logic region B around the light-receiving region A. The photodiode may be formed in the light-receiving region A of the semiconductor substrate 100. As described above, the light-receiving region A may be defined by the first device isolation layer 120, and the pixel region P may be defined by the second device isolation layer 130. The logic region B may be defined between the first device isolation layer 120 and the second device isolation layer 130. The first device isolation layer 120 may be formed to surround the n-type impurity region 111 of the photodiode. For example, a portion of a sidewall of the first device isolation layer 120 may be in contact with the n-type impurity region 111. A portion of another sidewall of the first device isolation layer 120 may be in contact with the n-type doped well region 115 formed in the logic region B.

According to some embodiments, the first device isolation layer 120 may include a plurality of insulating layers, at least one of which has a refractive index different from that of silicon. The formation of the first device isolation layer 120 may include patterning the semiconductor substrate 100 to form a trench, and then, sequentially depositing a plurality of insulating layers to fill the trench. Accordingly, the first insulating layer 121 in contact with the p-type epitaxial layer 105 may extend toward the bottom surface of the trench and be in contact with, for example, the p-type deep well 103. The second insulating layer 123 may be deposited to cover conformally the first insulating layer 121.

The trench deposited with the first and second insulating layers 121 and 123 may be filled with a gap-fill layer 125, in which an air gap may be formed. Alternatively, the first device isolation layer 120 may include the first insulating layer 121 conformally covering the trench and the second insulating layer 123 filling the trench with the first insulating layer 121. Moreover, although an air gap has been discussed herein by way of example, any gap may be used according to various embodiments of the present disclosure. A gap may be defined, for example, as any void, cavity, or unobstructed space, and may be a gap filled with air (e.g., an air gap), a gap filled with an inert gas or gases (e.g., an inert gas gap), a gap defining a vacuum (e.g., a vacuum gap), etc.

Figure 11:
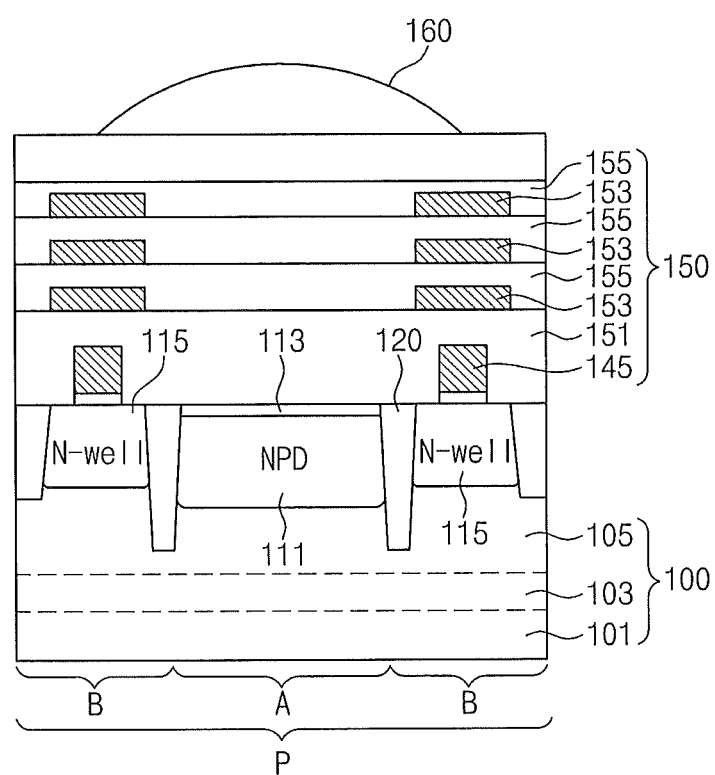

As shown in FIG. 11, the bottom surface of the first device isolation layer 120 surrounding the n-type impurity region 111 of the photodiode may be spaced apart from the p-type deep well 103. For example, the bottom surface of the first device isolation layer 120 may be positioned between the bottom surface of the n-type impurity region 111 and the top surface of the p-type deep well 103.

Figure 12:
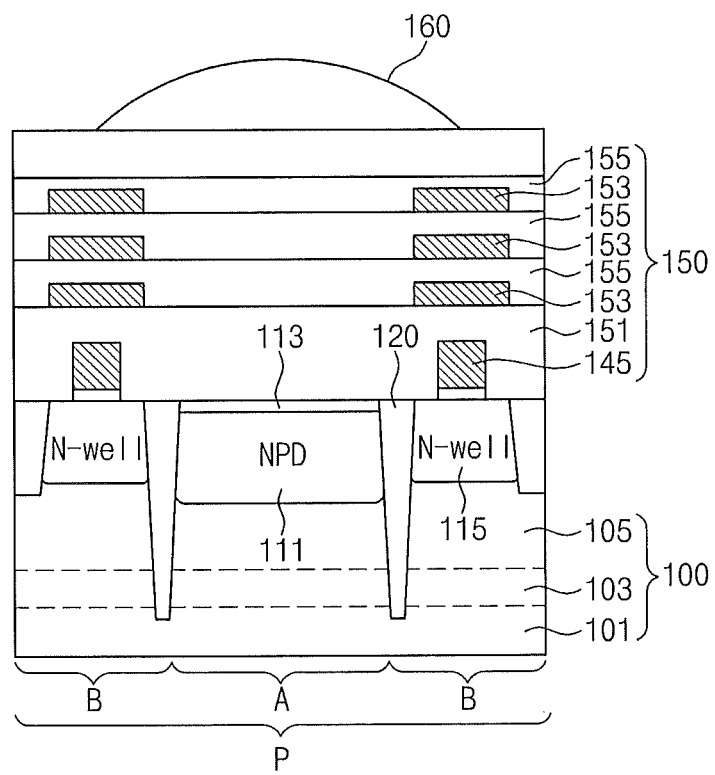

As shown in FIG. 12, the first device isolation layer 120 may extend toward the p-type bulk substrate 101 through the p-type deep well 103. For example, the bottom surface of the first device isolation layer 120 may be in contact with the p-type bulk substrate 101.

Figure 13:
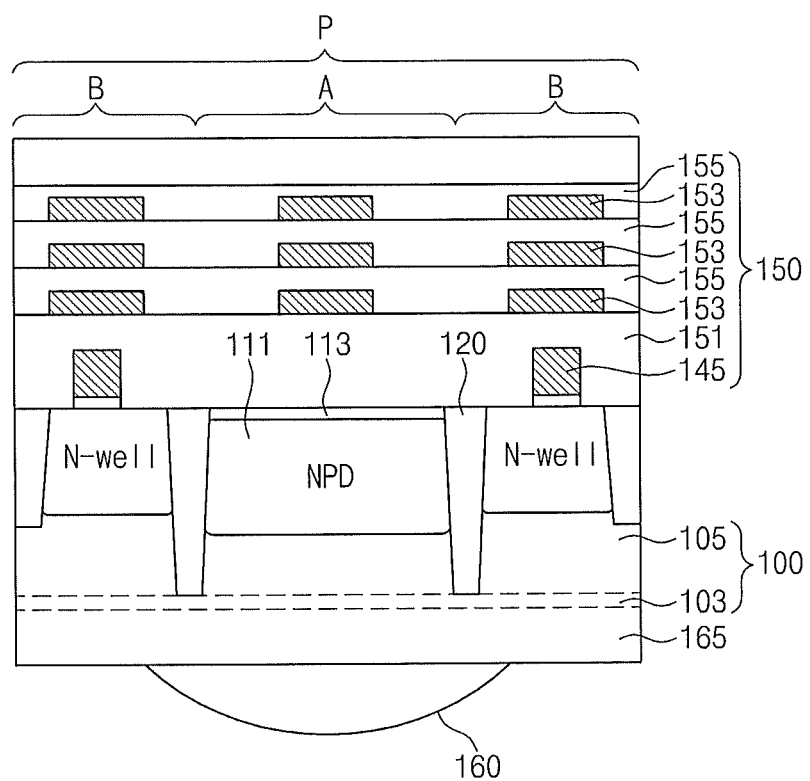
Figure 14:
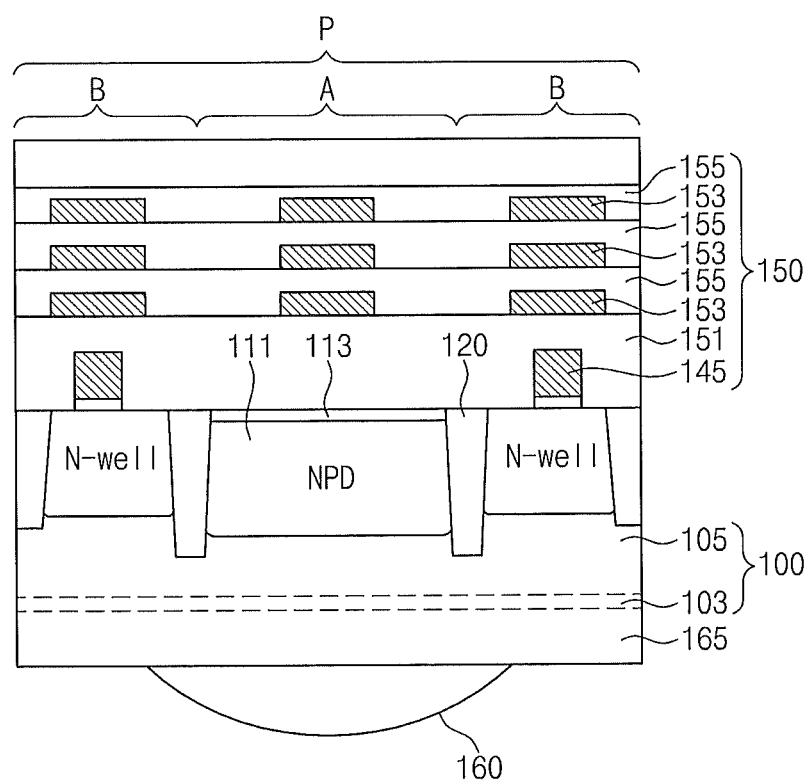
Figure 15:
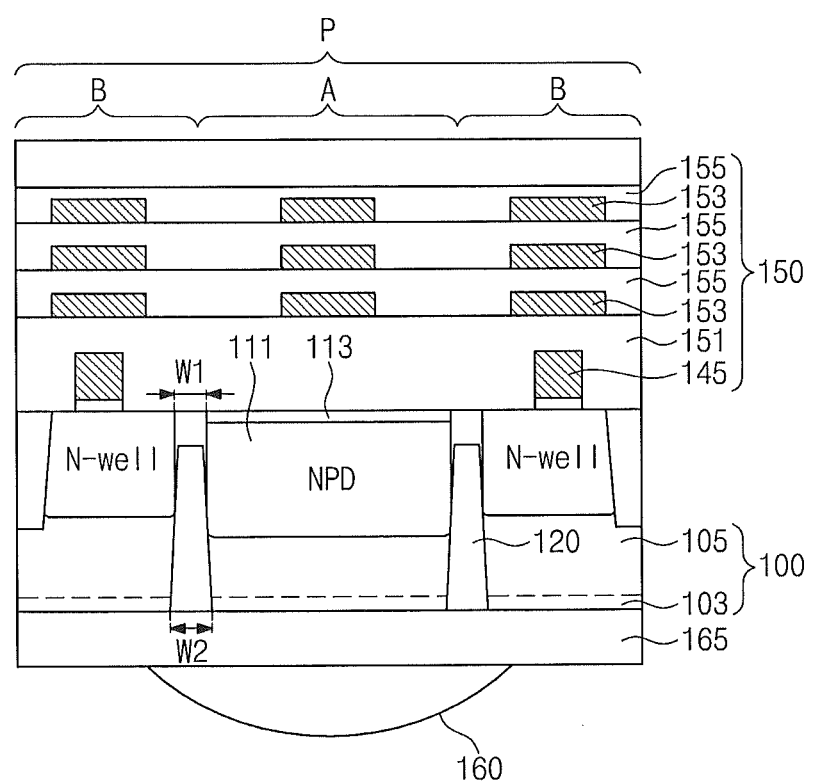

As shown in FIGS. 13 through 15, when viewed in a vertical section, the semiconductor substrate 100 may be provided between the wiring layer 150 and the micro-lens 160. As described herein, the semiconductor substrate 100 may include a plurality of the pixel regions P, each of the plurality of pixel regions including the light-receiving region A and the logic region B surrounding the light-receiving region A. According to some embodiments, the semiconductor substrate 100 may include the p-type epitaxial layer 105 and the p-type deep well 103. The p-type epitaxial layer 105 and the p-type deep well 103 may be formed in the p-type bulk substrate 101, as described with reference to FIGS. 6 and 7.

In the semiconductor substrate 100, the light-receiving region A may be defined by the first device isolation layer 120, and the pixel region P may be defined by the second device isolation layer 130. The logic region B may be defined between the first device isolation layer 120 and the second device isolation layer 130.

The n-type impurity region 111 may be formed in the light-receiving region A defined by the first device isolation layer 120, and the p-type impurity region 113 may be formed on the n-type impurity region 111. The first device isolation layer 120 may be formed to surround the n-type impurity region 111 of the photodiode. For example, a portion of a sidewall of the first device isolation layer 120 may be in contact with the n-type impurity region 111. A portion of another sidewall of the first device isolation layer 120 may be in contact with the n-type doped well region 115 formed in the logic region B.

The second device isolation layer 130 may be provided between the pixel regions P, and the vertical depth of the second device isolation layer 130 may be smaller than that of the first device isolation layer 120. The NMOS and PMOS transistors NT and PT may be provided on the logic region B of the semiconductor substrate 100. In example embodiments, the n-type doped well region 115 may be formed in the p-type epitaxial layer 105 of the logic region B.

The wiring layer 150 may be provided on the front surface of the semiconductor substrate 100 with the first and second device isolation layers 120 and 130. The wiring layer 150 may include the NMOS and PMOS transistors NT and PT integrated on the logic region B and the lower interlayer insulating layer 151 covering the NMOS and PMOS transistors NT and PT. Further, the wiring layer 150 may include a plurality of upper interlayer insulating layers 155 vertically stacked one on the other and a plurality of metal interconnection lines 153 vertically stacked one on the other (for example, between the interlayer insulating layers 155).

As shown in FIGS. 13 through 15, the metal interconnection lines 153 may be stacked on not only the logic region B but also the light-receiving region A. For example, the metal interconnection lines 153 may be disposed on the n-type impurity region 111.

Further, the micro-lenses 160 may be provided adjacent to the p-type deep well 103 of the semiconductor substrate 100 to face a corresponding one of the light-receiving regions A. A buffer insulating layer 165 may be interposed between the micro-lenses 160 and a p-type deep well 103 to protect the back surface of the semiconductor substrate 100. In addition, a color filter layer may be interposed between the buffer insulating layer 165 and the micro-lenses 160 to realize color images.

As shown in FIG. 13, the bottom surface of the n-type impurity region 111 may be spaced apart from the p-type deep well 103, and the bottom surface of the first device isolation layer 120 may be in contact with the p-type deep well 103. As shown in FIG. 14, the bottom surfaces of the n-type impurity region 111 and the first device isolation layer 120 may be spaced apart from the p-type deep well 103, and when viewed in a vertical section, the bottom surface of the first device isolation layer 120 may be positioned between the bottom surface of the n-type impurity region 111 and the top surface of the p-type deep well 103.

Figure 16:
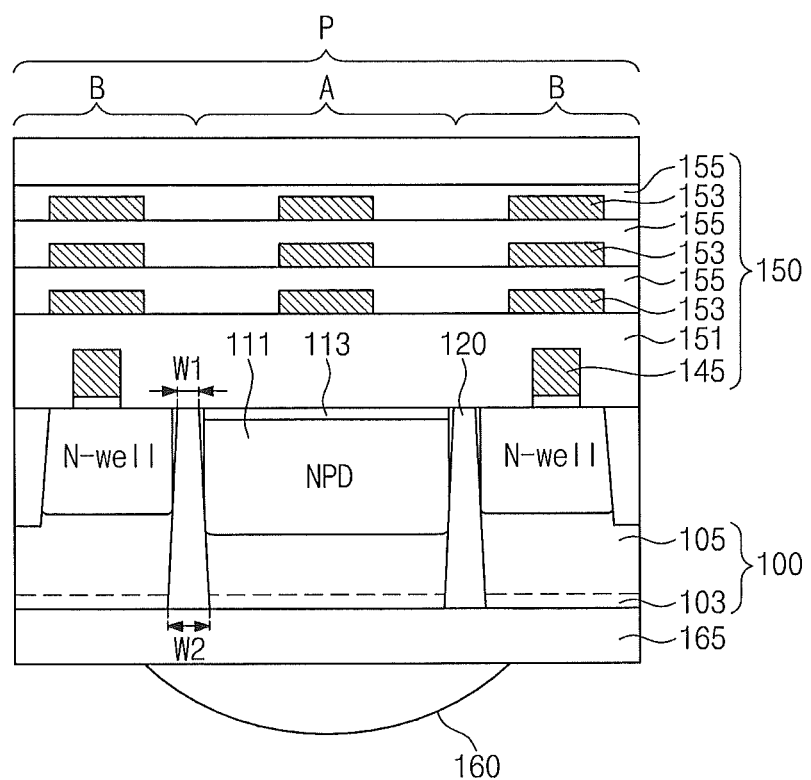

As shown in FIGS. 15 and 16, the first device isolation layer 120 defining the light-receiving region A may be formed in the trench. The trench may be formed by patterning the semiconductor substrate 100 using a mask pattern formed on the p-type deep well 103. Accordingly, a width of the first device isolation layer 120 may be smaller near the front surface of the semiconductor substrate 100 than near the back surface of the semiconductor substrate 100. Furthermore, as shown in FIG. 15, the first device isolation layer 120 may surround the sidewall of the n-type impurity region 111 but be spaced apart from the front surface of the semiconductor substrate 100. Alternatively, as shown in FIG. 16, the first device isolation layer 120 may penetrate the p-type epitaxial layer 105 and be in contact with the lower interlayer insulating layer 151 of the wiring layer 150.

Figure 17:
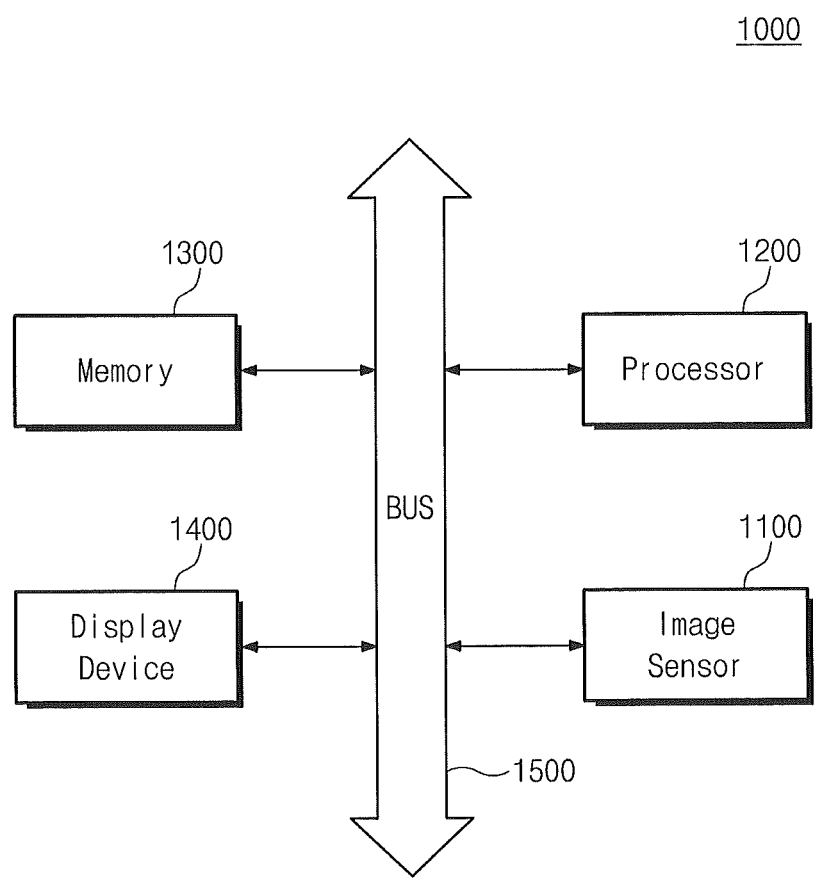
FIG. 17 is a block diagram illustrating an electronic device including a CMOS image sensor according to example embodiments of the inventive concepts.
Figure 18:
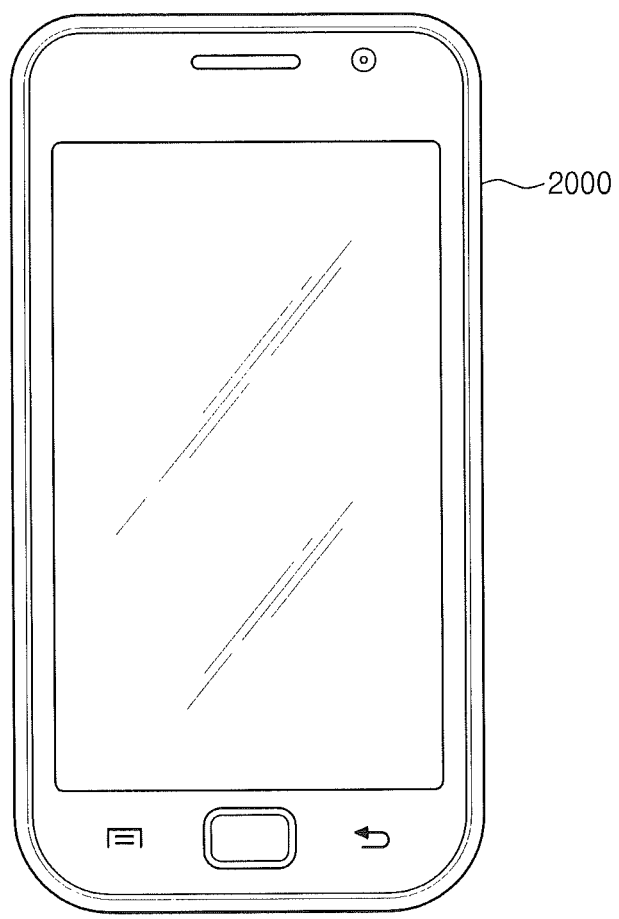
FIG. 18 is a diagram illustrating an example of electronic devices including a CMOS image sensor according to example embodiments of the inventive concepts.

FIG. 17 is a schematic block diagram illustrating an example of processor-based systems including a CMOS image sensor according to example embodiments of the inventive concepts. FIG. 18 is a schematic diagram illustrating an electronic device including a CMOS image sensor according to example embodiments of the inventive concepts. The electronic device of FIG. 18 may be one of digital cameras or mobile devices.

Referring to FIG. 17, a processor-based system 1000 may include an image sensor 1100, a processor 1200, a memory 1300, a display 1400, and a bus 1500. The image sensor 1100 may capture external images in response to control signals of the processor 1200. The processor 1200 may store the captured image information in the memory 1300 through the bus 1500. The processor 1200 may output the image stored in the memory 1300 to display the image on the display 1400.

The system 1000 may include computer systems, camera systems, scanners, machined watch systems, navigation systems, videophones, monitoring systems, automatic focus systems, tracking systems, motion monitoring systems, and image stabilization systems, but is not limited thereto. Further, in the case where the processor-based system 1000 is applied to mobile devices, a battery may be further provided to supply operating power to the mobile devices.

As shown in FIG. 18, the CMOS image sensor according to example embodiments of the inventive concepts may be applied to realize a mobile phone 2000. Alternatively, the CMOS image sensor may be used to realize a smart phone, a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

According to example embodiments of the inventive concepts, the CMOS image sensor may include pixels (e.g., pixel regions), each of the plurality of pixel regions including a light-receiving region and a logic region around the light-receiving region. The light-receiving region may be surrounded by a device isolation layer preventing/impeding carriers produced in the light-receiving region from being flowed into the logic region or preventing/impeding light from being incident into the logic region of the semiconductor substrate. Accordingly, it may be possible to prevent/protect electric characteristics of NMOS and PMOS transistors in the logic region from being deteriorated.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A CMOS image sensor, comprising:
a semiconductor substrate of a first conductivity type comprising a plurality of pixel regions, each of the plurality of pixel regions comprising a light-receiving region and a logic region around the light-receiving region;
a photoelectric conversion layer of a second conductivity type in the light-receiving region of the semiconductor substrate;
a first device isolation layer in the semiconductor substrate to define the light-receiving region of each of the pixel regions, wherein the first device isolation layer surrounds the photoelectric conversion layer when viewed from a plan view and is in contact with a sidewall of the photoelectric conversion layer; and
a second device isolation layer in the semiconductor substrate to define the logic region,
wherein the second device isolation layer comprises a first depth in the semiconductor substrate that is shallower than a second depth of the first device isolation layer in the semiconductor substrate, and
wherein, the photoelectric conversion layer extends to a third depth that is deeper than the first depth of the second device isolation layer and shallower than the second depth of the first device isolation layer.

2. The CMOS image sensor of claim 1, further comprising:
a doped well impurity layer of the second conductivity type in a portion of the logic region of the semiconductor substrate;
NMOS transistors on the logic region of the semiconductor substrate; and
PMOS transistors on the doped well impurity layer.

3. The CMOS image sensor of claim 2, wherein the doped well impurity layer is between the first and second device isolation layers.

4. The CMOS image sensor of claim 1, wherein the first device isolation layer comprises an insulating layer comprising a first refractive index that is smaller than a second refractive index of the semiconductor substrate.

5. The CMOS image sensor of claim 1, wherein:
the first device isolation layer comprises at least two insulating layers comprising different respective refractive indices; and
one of the at least two insulating layers contacts the semiconductor substrate and has a first refractive index that is different from a second refractive index of the semiconductor substrate.

6. The CMOS image sensor of claim 1, further comprising a doped impurity layer of the first conductivity type in the semiconductor substrate and spaced apart from a surface of the semiconductor substrate,
wherein a surface of the first device isolation layer contacts the doped impurity layer of the first conductivity type.

7. The CMOS image sensor of claim 1, further comprising a doped impurity layer of the first conductivity type in the semiconductor substrate and spaced apart from a surface of the semiconductor substrate,
wherein the first device isolation layer extends into the doped impurity layer of the first conductivity type.

8. The CMOS image sensor of claim 1, further comprising:
a wiring layer on a surface of the semiconductor substrate, the wiring layer comprising a plurality of stacked interconnection lines on the logic region; and
a light transmission layer on the wiring layer, the light transmission layer comprising micro-lenses overlapping respective ones of the pixel regions.

9. The CMOS image sensor of claim 1, further comprising:
a wiring layer on a surface of the semiconductor substrate, the wiring layer comprising a plurality of stacked interconnection lines; and
a light transmission layer on a surface of the semiconductor substrate, the light transmission layer comprising microlenses overlapping respective ones of the pixel regions.

10. The CMOS image sensor of claim 9, wherein the first device isolation layer comprises a tapered width in the semiconductor substrate.

11. A CMOS image sensor comprising:
a semiconductor substrate comprising a light-receiving region and a logic region around the light-receiving region;
a photoelectric conversion region in the light-receiving region; and
an isolation region defining a perimeter around the photoelectric conversion region in the semiconductor substrate and comprising an interface with a sidewall of the photoelectric conversion region, the isolation region comprising a first refractive index smaller than a second refractive index of the semiconductor substrate,
wherein:
the isolation region is between the logic region and the sidewall of the photoelectric conversion region;
the isolation region surrounds the photoelectric conversion region, in a plan view, and is in contact with the sidewall of the photoelectric conversion region;
the semiconductor substrate comprises a first conductivity type;
the photoelectric conversion region comprises a second conductivity type different from the first conductivity type;
the light-receiving region is configured to convert an optical signal into an electrical signal;
the logic region comprises circuitry configured to process the electrical signal;
the isolation region comprises a first depth in the semiconductor substrate that is deeper than a second depth of the photoelectric conversion region in the semiconductor substrate;
the semiconductor substrate comprises an epitaxial layer of the first conductivity type in the logic region;
the isolation region is between the epitaxial layer of the first conductivity type in the logic region and the sidewall of the photoelectric conversion region;
the CMOS image sensor further comprises a micro-lens that overlaps the photoelectric conversion region;
the isolation region comprises a first isolation region comprising a tapered width in the semiconductor substrate; and
the CMOS image sensor further comprises a second isolation region that is adjacent the logic region and that comprises a third depth that is shallower in the semiconductor substrate than the second depth of the photoelectric conversion region and is shallower in the semiconductor substrate than the first depth of the first isolation region.

* * * * *